United States Patent
Baek et al.

(10) Patent No.: US 8,107,297 B2
(45) Date of Patent: Jan. 31, 2012

(54) METHOD OF READING NONVOLATILE MEMORY DEVICE AND METHOD OF OPERATING NONVOLATILE MEMORY DEVICE

(75) Inventors: Kwang Ho Baek, Gyeonggi-do (KR); Sam Kyu Won, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/023,868

(22) Filed: Feb. 9, 2011

(65) Prior Publication Data
US 2011/0128783 A1    Jun. 2, 2011

Related U.S. Application Data

(63) Continuation of application No. 12/493,306, filed on Jun. 29, 2009, now Pat. No. 7,898,865.

(30) Foreign Application Priority Data

Aug. 19, 2008   (KR) .................. 10-2008-0080803

(51) Int. Cl.
*G11C 16/06*    (2006.01)

(52) U.S. Cl. ........... 365/185.2; 365/185.24; 365/185.29; 365/185.11; 365/189.04

(58) Field of Classification Search ............... 365/185.2, 365/185.24, 185.29, 185.11, 189.04
See application file for complete search history.

(56) References Cited

U.S. PATENT DOCUMENTS
2009/0046505 A1*  2/2009  Lee et al. .................. 365/185.2
* cited by examiner

*Primary Examiner* — Thong Q Le
(74) *Attorney, Agent, or Firm* — IP & T Group LLP

(57) ABSTRACT

A method of reading a nonvolatile memory device may include, after an $n^{th}$ erase operation is performed, reading dummy cells on which a program operation has been performed based on a first read voltage, where n is an integer greater than zero, counting a number of dummy cells that are read as having a threshold voltage lower than the first read voltage, when the number is a critical value or more, resetting a read voltage, and performing, based on the reset read voltage, a read operation on memory cells that belong to the same memory cell block as the dummy cells and on which a program operation has been performed on the memory cells after the $n^{th}$ erase operation has been performed.

16 Claims, 3 Drawing Sheets

METHOD OF READING NONVOLATILE MEMORY DEVICE AND METHOD OF OPERATING NONVOLATILE MEMORY DEVICE

CROSS-REFERENCES TO RELATED APPLICATIONS

This application is a Continuation of U.S. patent application Ser. No. 12/493,306 filed on Jun. 29, 2009 and issued on Mar. 1, 2011 as U.S. Pat. No. 7,898,865, which claims priority of Korean patent application number 10-2008-0080803 filed on Aug. 19, 2008. The disclosure of each of the foregoing applications is incorporated herein by reference in its entirety.

BACKGROUND

One or more embodiments relate to a method of reading a nonvolatile memory device and a method of operating a nonvolatile memory device.

Recently, there has been an increasing demand for nonvolatile memory devices which can be electrically programmed and erased and do not require the refresh function of rewriting data at specific periods. Here, an operation for filling a floating gate with electrons is called a program operation, and an operation for discharging electrons filled into the floating gate is called an erase operation.

A nonvolatile memory cell enables electrical program/erase operations and performs the program and erase operations by varying a threshold voltage when electrons are migrated by a strong electric field applied to a thin oxide layer.

The nonvolatile memory device typically includes a memory cell array in which cells for storing data are arranged in a matrix form and a page buffer for writing data into specific cells of the memory cell array or reading data stored in specific cells thereof. The page buffer includes a bit line pair connected to a specific memory cell, a register for temporarily storing data to be written into the memory cell array or reading the data of a specific cell from the memory cell array and temporarily storing the read data, a sensing node for detecting the voltage level of a specific bit line or a specific register, and a bit line selection unit for controlling whether to connect the specific bit line to the sensing node.

In the memory cells of such a nonvolatile memory device, the threshold voltage of an initial program state is ideally maintained by sustaining charges stored in the floating gate. In an actual operation, however, charges stored in the floating gate are discharged therefrom, thereby lowering the threshold voltage of the cell. A characteristic pertinent to the charge retention ability of a memory cell is called the retention characteristic of a nonvolatile memory cell. That is, a memory cell having relatively superior retention characteristic has relatively superior charge retention ability, so discharge of charges stored in the floating gate is prevented or reduced.

If this retention characteristic is poor, failure may happen when a read operation is performed because the threshold voltage is lowered. In particular, if state-based read margin for distinguishing between different states is narrow as in a multi-level cell program operation, a read failure operation may occur because of the poor retention characteristic.

BRIEF SUMMARY

One or more embodiments are directed towards a read method which is capable of compensating for a read voltage by indirectly measuring the lapse of time between the start of a program operation and a read operation in order to prevent the occurrence of read failure attributable to a retention characteristic.

One or more embodiments are directed to a method of reading a nonvolatile memory device may include, after an $n^{th}$ erase operation is performed, reading dummy cells on which a program operation has been performed based on a first read voltage, where n is an integer greater than zero, counting a number of dummy cells that are read as having a threshold voltage lower than the first read voltage, when the number is a critical value or more, resetting a read voltage, and performing, based on the reset read voltage, a read operation on memory cells that belong to the same memory cell block as the dummy cells and on which a program operation has been performed on the memory cells after the $n^{th}$ erase operation has been performed.

One or more embodiments are directed to a method of reading a nonvolatile memory device, including providing a memory cell block on which a program operation has been performed on dummy cells and memory cells from after an $n^{th}$ erase operation to before an $(n+1)^{th}$ erase operation, where n is an integer greater than zero, reading the dummy cells based on a first read voltage, counting a number of dummy cells that are read as having a threshold voltage lower than the first read voltage, when the number is a critical value or more, resetting a read voltage, and performing a read operation on the memory cells based on the reset read voltage.

One or more embodiments are directed to a method of operating a nonvolatile memory device, including performing a program operation on dummy cells within a memory cell block on which an $n^{th}$ erase operation has been performed, where n is an integer greater than zero, performing a program operation on memory cells within the memory cell block, reading the dummy cells based on a first read voltage, when a number of dummy cells that are read as having a threshold voltage lower than the first read voltage is a critical value or more, resetting a read voltage, and performing a read operation on the memory cells based on the reset read voltage.

One or more embodiments are directed to a method of operating a nonvolatile memory device, including performing a program operation on memory cells within a memory cell block on which an $n^{th}$ erase operation has been performed, where n is an integer greater than zero, performing a program operation on dummy cells within the memory cell block, reading the dummy cells based on a first read voltage, when a number of dummy cells that are read as having a threshold voltage lower than the first read voltage is a critical value or more, resetting a read voltage, and performing a read operation on the memory cells based on the reset read voltage.

DESCRIPTION OF SPECIFIC EMBODIMENT

Hereinafter, the present disclosure will be described in detail in connection with one or more embodiments with reference to the accompanying drawings. The figures are provided to allow those having ordinary skill in the art to understand the scope of one or more embodiments of the disclosure.

Figure 1:
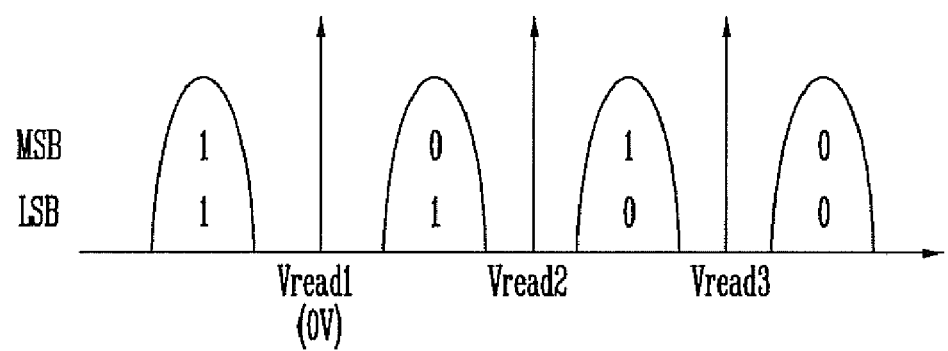
FIG. 1 is a diagram showing the distributions of memory cells according to a typical multi-level cell program performed on a nonvolatile memory device.

FIG. 1 is a diagram showing the distributions of memory cells according to a typical multi-level cell program performed on a nonvolatile memory device.

There are shown, in FIG. 1, distributions (for example, threshold distributions) of memory cells according to a 2-bit multi-level cell program. This drawing shows four states of cells, indicating different data depending on the Least Significant Bit (LSB) and the Most Significant Bit (MSB).

When a program operation is performed, distributions depending on the amount of electrons, stored in the respective floating gates of memory cells, are formed. In the case of '11,' corresponding cells are recognized as erase cells and, in the case of '01,' '10,' and '00,' corresponding cells are recognized as program cells. Here, it is assumed that the erase cells indicated by '11' have a first state, the cells indicated by '01' have a second state, the cells indicated by '10' have a third state, and the cells indicated by '00' have a fourth state.

When the amount of charges stored in the floating gate increases, the threshold voltage of the memory cell rises. Each of the states is read based on a read voltage applied to a word line. Three different read voltages (Vread1, Vread2, and Vread3) are necessary because the four states exist.

Figure 2:
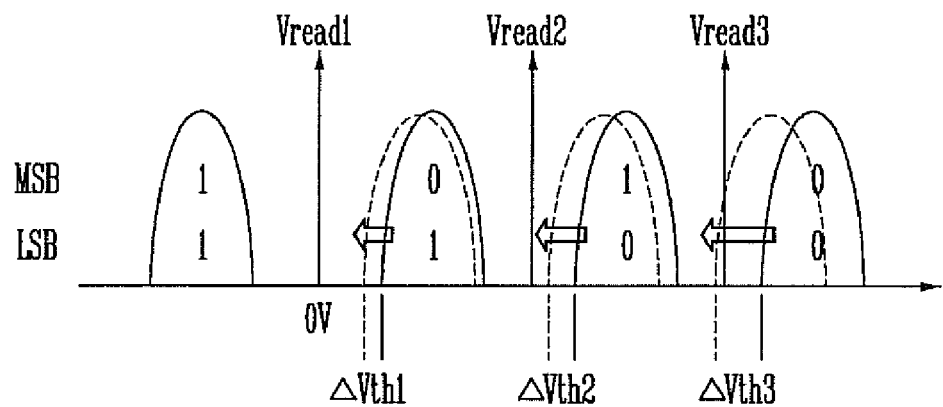
FIG. 2 is a diagram showing the retention characteristic of a nonvolatile memory device.

FIG. 2 is a diagram showing the retention characteristic of a nonvolatile memory device.

As shown in FIG. 2, after some time elapses from a first program state, each of the distributions of the threshold voltages increases. Ideally, each cell maintains charges stored in its floating gate in order to maintain the threshold voltage of an initial program state. In an actual operation, however, charges stored in the floating gate are discharged therefrom, thereby lowering the threshold voltage of the cell. A characteristic pertinent to the charge retention ability of a memory cell as described above is called the retention characteristic of a nonvolatile memory cell. That is, a memory cell having a relatively superior retention characteristic has relatively superior charge retention ability, so charges stored in the floating gate are rarely discharged.

Meanwhile, when the threshold voltage of a memory cell rises, the retention characteristic becomes comparatively poor. That is, the threshold voltages of the cells having the fourth state TOOT may become lower than the threshold voltages of the cells having the second state '01'. Assuming that the threshold voltage of the cells having the fourth state is lowered by the third amount of change ($\Delta Vth3$), the threshold voltage of the cells having the third state is lowered by the amount of change smaller than the third amount of change. Here, if the threshold voltage of the cells having the fourth state '00' becomes lower than the third read voltage (Vread3) because of the retention characteristic, a failure event in which the cells having the fourth state are read as having the third state is generated.

Figure 3:
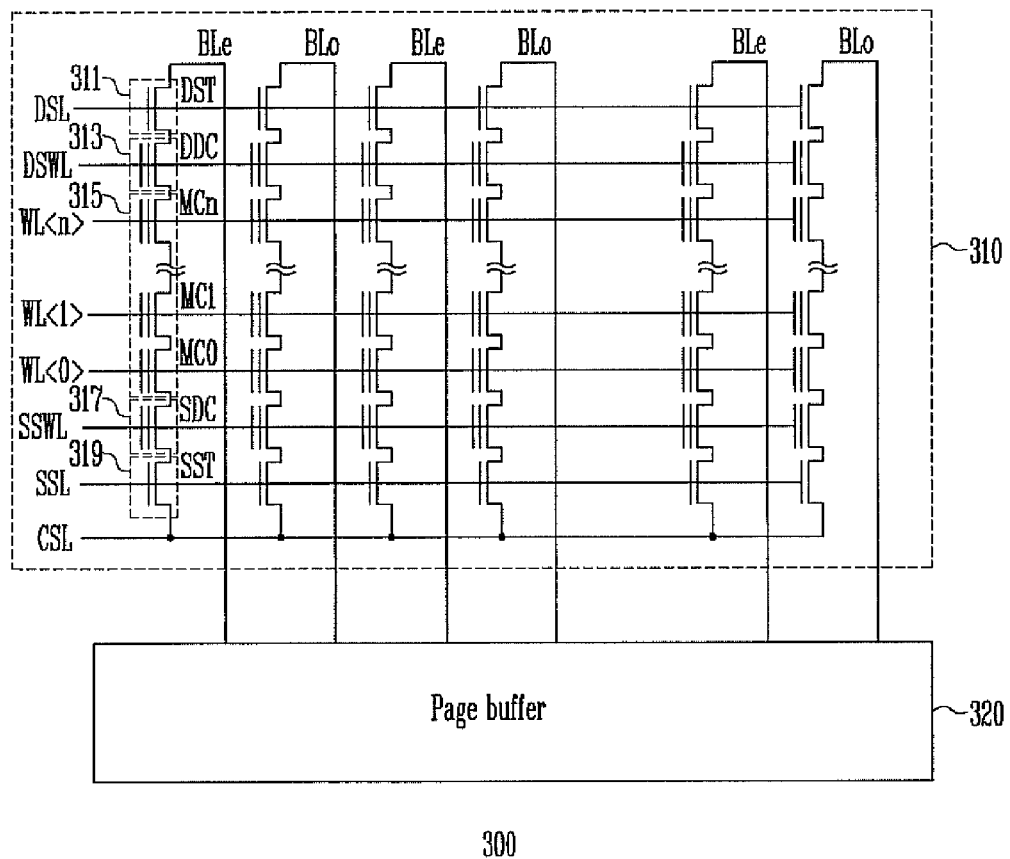
FIG. 3 is a detailed diagram showing the memory cell array of a nonvolatile memory device according to an embodiment.

FIG. 3 is a detailed diagram showing the memory cell array of a nonvolatile memory device according to an embodiment.

The nonvolatile memory device 300 includes a memory cell array 310 and a page buffer 320.

The memory cell array 310 includes cell strings 315 each having memory cells MC0 to MCn configured to store data, drain select transistors (DST) 311 each configured to selectively connect the memory cells and a bit line, source select transistor (SST) 319 each configured to selectively connect the memory cells and a common source line (CSL), drain-side dummy cells (DDC) 313 each connected between each of the memory cells MCn and each of the drain select transistors 311, and source-side dummy cells (SDC) 317 each connected between each of the memory cells MC0 and each of the source select transistors 319. The memory cell array 310 is one unit memory cell block.

The memory cells MC0 to MCn of each of the cell strings 315 is subject to a program, read, or erase operation according to various high voltages applied through respective word lines WL<0 to n>. Each of the drain select transistors (DST) selectively connects the bit line and each of the drain-side dummy cells (DDC) 313 according to voltage applied through the drain select line (DSL). Each of the source select transistors (SST) selectively connects the common source line (CSL) and each of the source-side dummy cells (SDC) 317 according to voltage applied through the source select line (SSL).

Each of the drain-side dummy cell (DDC) 313 and the source-side dummy cell (SDC) 317 is a nonvolatile memory cell having the same characteristic as each of the memory cells MC0 to MCn. That is, each of the drain-side dummy cell (DDC) 313 and the source-side dummy cell (SDC) 317 may be subject to a program operation, a read operation, or an erase operation while having the same characteristic as the memory cell. In an embodiment, a read voltage for memory cells is changed based on the retention state of dummy cells by performing a program operation for the dummy cells when a program operation is performed on the memory cells. Accordingly, each of the dummy cells 313 and 317 may be configured to have the same characteristic as each of the memory cells MC0 to MCn. Meanwhile, the drain-side dummy cell (DDC) 313 is subject to a program operation, a read operation, or an erase operation by a drain-side dummy word line (DSWL), and the source-side dummy cell (SDC) 319 is subject to a program operation, a read operation, or an erase operation by a source-side dummy word line (SSWL).

According to one or more embodiments, the memory cell array may be configured to include only one of the source-side dummy cells or the drain-side dummy cells.

Figure 4:
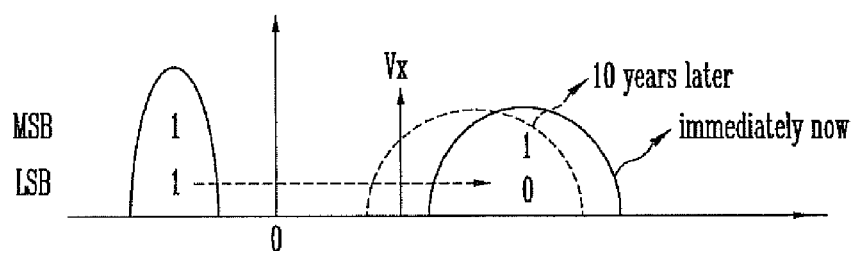
FIG. 4 is a diagram showing the concept of a method of reading the nonvolatile memory device according to an embodiment.

FIG. 4 is a diagram showing the concept of a method of reading the nonvolatile memory device according to an embodiment.

In order to perform a read operation by compensating for the retention characteristic of a nonvolatile memory device, a read voltage may be set in accordance with the lapse of time between the start of a program operation and the read operation. However, since such a time may not be directly measured due to the power supply being discontinued, an indirect method for the measurement may be used.

That is, in one or more embodiments, all the dummy cells are programmed to have the second state '10' immediately before the start of a program operation for memory cells or immediately after the program operation for the memory cells. Next, cells which are read as having the first state '11' (i.e., the number of failure cells) are counted by first reading the dummy cells immediately before the start of a read operation for the memory cells.

In the state where a predicted distribution of threshold voltages after a lapse of 10 years from being programmed is as shown in FIG. 4, for example, the read operation may be performed based on a first read voltage Vx. In the case where there are cells having a threshold voltage lower than the first read voltage Vx, it may be determined that 10 years have passed since a program operation performed on the cells. The elapse of time is determined using this indirect method, and a read voltage applied in a read operation for a memory cell is changed.

Figure 5:
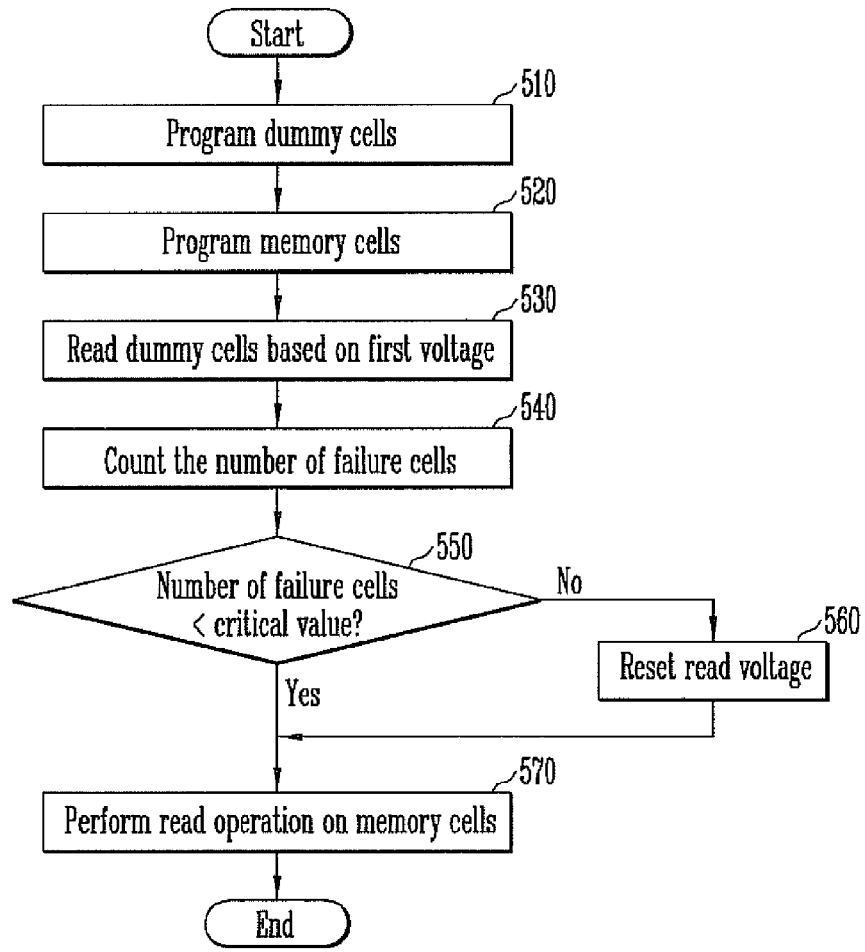
FIG. 5 is a flowchart showing a method of reading the nonvolatile memory device according to an embodiment.

FIG. 5 is a flowchart showing a method of reading the nonvolatile memory device according to an embodiment.

A program operation is first performed on dummy cells and memory cells, included in the same memory cell block, at steps 510 and 520, respectively. It is shown in the drawing that the program operation is first performed on the dummy cells. However, a program operation for the memory cells may be first performed, and a program operation for the dummy cells may then be performed. The dummy cells are used to determine the lapse of time between the start of the program operation for the memory cells and a read operation. Accordingly, the program operation for the dummy cells has only to be performed before the start of the program operation for the memory cells or after the program operation for the memory cells.

The program operation is performed on a page-by-page basis. Further, the program operation for the memory cells is performed after an erase operation for the entire memory cell block has been performed. The number of times of erase operations for the memory cells and the dummy cells is the same as the number of times of erase operations for the same memory cell block.

The program operation for the dummy cells and the memory cells may be performed between an $n^{th}$ erase operation and an $(n+1)^{th}$ erase operation.

Meanwhile, according to one or more embodiments, the program operation for the memory cells may be a single level cell program operation or multi-level cell program operations. The present disclosure may be applied to the single level cell program method because the retention characteristic also applies to the single level cell program method. However, state-based read margin for distinguishing between different states (for example, in terms of voltages) is narrow because several distributions exist in the multi-level cell program methods. Accordingly, in the multi-level cell program methods, a read failure problem attributable to the retention characteristic may be great.

The program operation for the dummy cells is performed according to the single level cell program method, thereby making all the dummy cells a program state. Alternatively, all the dummy cells may be programmed to have the second state of FIG. 1 according to the LSB program method from among the multi-level cell program methods. Dummy cells within a memory cell block including memory cells, subject to programming according to the above method, all become a program state.

A read operation is then performed on the dummy cells based on the first read voltage Vx at step 530.

The first read voltage Vx is set with the retention characteristic of the nonvolatile memory cells taken into consideration. That is, if it is sought to guarantee the 10-year data retention period, the amount of reduction in the threshold voltage when 10 years have passed may be predicted through experiments, etc. and the first read voltage may be then properly set with the amount of reduction taken into consideration. The first read voltage may be set between the threshold voltage of cells having the lowest threshold voltage after a lapse of a selection period and the threshold voltage of cells having the lowest threshold voltage immediately after a program operation for dummy cells has been performed.

After the read operation is performed based on the first read voltage, the number of failure cells generated by the read operation is counted at step 540.

It is then determined whether the number of failure cells counted is less than a critical value at step 550. If the number of failure cells counted is determined to be less than the critical value, it is considered that the selection period has not elapsed. Here, the critical value may be variously set depending on a value of the first read voltage, process parameters of each cell, a dummy cell, the number of memory cells, and so on.

If, as a result of the determination at step 550, the number of failure cells counted is determined to be less than the critical value, it is considered that the selection period has not elapsed and a read operation is performed on the memory cells based on an initially set read voltage at step 570.

However, if, as a result of the determination at step 550, the number of failure cells counted is determined to be the critical value or more, it is considered that the selection period has elapsed and the read voltage is reset at step 560. A method of resetting read voltages is described below in detail.

Figure 6:
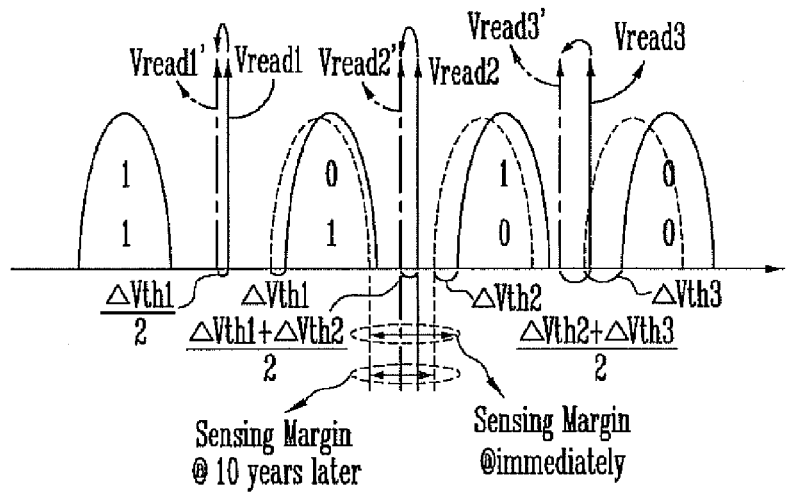
FIG. 6 is a diagram showing a method of resetting read voltages in the method of reading a nonvolatile memory device according to an embodiment.

FIG. 6 is a diagram showing a method of resetting read voltages in the method of reading a nonvolatile memory device according to an embodiment.

Distributions, each indicated by a solid line, are distributions immediately after a program operation. Distributions, each indicated by a dotted line, are distributions after a lapse of a selection period (i.e., a case where the number of failure cells counted is a critical value or more). It can be seen that the threshold voltages of the respective distributions are as a whole lowered, but the degree of lowering in each of the threshold voltages differs on a state-by-state basis. Here, it is assumed that the amount of change in the threshold voltage of cells having the second state is called the first amount of change ($\Delta Vth1$), the amount of change in the threshold voltage of cells having the third state is called the second amount of change ($\Delta Vth2$), and the amount of change in the threshold voltage of cells having the fourth state is called the third amount of change ($\Delta Vth3$).

At the early stage, a read voltage is set on the basis of distributions immediately after a first program operation. That is, a value, corresponding to the average of the highest threshold voltage value of the first state and the lowest threshold voltage value of the second state, is set to a first read voltage (Vread1), and a value, corresponding to the average of the highest threshold voltage value of the second state and the lowest threshold voltage value of the third state, is set to a second read voltage (Vread2). Next, a value, corresponding to the average of the highest threshold voltage value of the third state and the lowest threshold voltage value of the fourth state, is set to a third read voltage (Vread3). This is for the purpose of securing the state-based read margin to the maximum extent possible. If the distributions of threshold voltages are changed as described above, however, the secured read margins are changed on a state-by-state basis.

Accordingly, each of the read voltages is reset with the amount of change taken into consideration. In more detail, the first read voltage (Vread1) may be decreased by an average value of the amount of change in the first state (for example, a change in the threshold voltages of cells having the first state) and the first amount of change (i.e., the amount of change in the second state). Here, assuming that the amount of change in the threshold voltage may be disregarded because the first state is an erase state, the first read voltage (Vread 1) is set low by half the first amount of change. Further, the second read voltage (Vread2) is decreased by an average value of the first amount of change (i.e., the amount of change in the second state) and the second amount of change (i.e., the amount of change in the third state). Further, the third read voltage (Vread3) is decreased by an average value of the second amount of change (i.e., the amount of change in the third state) and the third amount of change (i.e., the amount of change in the fourth state). As described above, the first to third read voltages are reset, and the read operation is then performed based on the reset read voltages.

Referring back to FIG. 5, if the number of failure cells counted is less than the critical value, a read operation is performed based on an initially set read voltage. If the number of failure cells counted is the critical value or more, a read operation is performed on the memory cells based on the read voltages reset at step 560.

As described above, when a program operation is performed on memory cells, a program operation is also performed on dummy cells. When the memory cells are read after a lapse of a certain time, the dummy cells are also read, thereby checking the lapse of time. Accordingly, different read voltages are set according to the checked lapse of time and applied.

Different read voltages are set with the lapse of time between the start of a program operation and a read operation taken into consideration, and a read operation is then performed based on the set read voltages. Accordingly, the occurrence of read failure attributable to the retention characteristic can be prevented.

What is claimed is:

1. A method of operating a nonvolatile memory device, comprising:
   providing memory cell block including memory cells and dummy cells;
   performing a program operation on the dummy cells and the memory cells;
   reading the dummy cells based on a read voltage;
   resetting the read voltage according to read data of the dummy cells; and
   reading the memory cells based on the reset read voltage.

2. The method of claim 1, wherein the resetting the read voltage comprises:
   counting a number of dummy cells that are read as having a threshold voltage lower than the read voltage; and
   decreasing the read voltage when the number is a critical value or more.

3. The method of claim 2, wherein the number is less than the critical value, performing the read operation on the memory cells based on an initially set read voltage.

4. The method of claim 1, wherein the program operation on the dummy cells is performed after programming the memory cells or before programming the memory cells.

5. The method of claim 1, wherein the reading operation on the dummy cells is performed after an $n^{th}$ erase operation is performed on the memory cell block.

6. The method of claim 5, wherein the n is an integer greater than zero.

7. The method of claim 1, wherein each of the dummy cells is a nonvolatile memory cell connected between the memory cells and a drain select transistor.

8. The method of claim 1, wherein each of the dummy cells is a nonvolatile memory cell connected between the memory cells and a source select transistor.

9. A method of operating a nonvolatile memory device, comprising:
   providing memory cell block including memory cells and dummy cells;
   performing a program operation on the memory cells;
   performing a program operation on the dummy cells;
   reading the dummy cells based on a first read voltage;
   resetting a read voltage according to a result of the reading operation on the dummy cells; and
   performing a read operation on the memory cells based on the reset read voltage.

10. The method of claim 9, wherein each of the dummy cells is a nonvolatile memory cell connected between the memory cells and a drain select transistor.

11. The method of claim 9, wherein each of the dummy cells is a nonvolatile memory cell connected between the memory cells and a source select transistor.

12. The method of claim 9, wherein the resetting of the read voltage comprises:
   decreasing the first read voltage by an average value of an amount of change in threshold voltages of the cells having a first state and a first amount of change in threshold voltages of cells having a second state;
   decreasing a second read voltage by an average value of the first amount of change and a second amount of change in threshold voltages of cells having a third state; and
   decreasing a third read voltage by an average value of the second amount of change and a third amount of change in threshold voltages of cells having a fourth state.

13. The method of claim 9, wherein the resetting the read voltage comprises:
   counting a number of dummy cells that are read as having a threshold voltage lower than the read voltage; and
   decreasing the read voltage when the number is a critical value or more.

14. The method of claim 9, wherein the program operation on the dummy cells is performed after programming the memory cells or before programming the memory cells.

15. The method of claim 9, wherein the reading operation on the dummy cells is performed after an $n^{th}$ erase operation is performed on the memory cell block.

16. The method of claim 15, wherein the n is an integer greater than zero.

* * * * *